US012740431B2

(12) United States Patent
Itani et al.

(10) Patent No.: US 12,740,431 B2
(45) Date of Patent: Sep. 15, 2026

(54) INDIUM PHOSPHIDE SUBSTRATE AND METHOD FOR PRODUCING INDIUM PHOSPHIDE SUBSTRATE

(71) Applicant: JX Advanced Metals Corporation, Tokyo (JP)

(72) Inventors: Kenya Itani, Kitaibaraki (JP); Hideki Kurita, Kitaibaraki (JP); Hideaki Hayashi, Kitaibaraki (JP)

(73) Assignee: JX ADVANCED METALS CORPORATION, Tokyo (JP)

(*) Notice: Subject to any disclaimer, the term of this patent is extended or adjusted under 35 U.S.C. 154(b) by 1266 days.

(21) Appl. No.: 17/603,277

(22) PCT Filed: May 26, 2020

(86) PCT No.: PCT/JP2020/020788
§ 371 (c)(1),
(2) Date: Oct. 12, 2021

(87) PCT Pub. No.: WO2021/019886
PCT Pub. Date: Feb. 4, 2021

(65) Prior Publication Data
US 2022/0189883 A1 Jun. 16, 2022

(30) Foreign Application Priority Data
Jul. 26, 2019 (JP) ................................ 2019-138229

(51) Int. Cl.
*H10W 46/00* (2026.01)
*B28D 5/00* (2006.01)
(Continued)

(52) U.S. Cl.
CPC .............. *H10W 46/00* (2026.01); *B28D 5/00* (2013.01); *C30B 29/40* (2013.01); *C30B 33/10* (2013.01);
(Continued)

(58) Field of Classification Search
CPC ......... H01L 21/02019; H01L 21/02021; H01L 21/02024; H01L 23/544;
(Continued)

(56) References Cited

U.S. PATENT DOCUMENTS 5,279,077 A 1/1994 Miyashita et al.
5,763,290 A 6/1998 Nakajima
(Continued)

FOREIGN PATENT DOCUMENTS

JP 62-290137 A 12/1987
JP 5-36709 A 2/1993
(Continued)

OTHER PUBLICATIONS

U.S. Office Action for U.S. Appl. No. 17/603,215, dated Dec. 3, 2024.

(Continued)

*Primary Examiner* — Jeff W Natalini
*Assistant Examiner* — Ian Isaac Degrasse
(74) *Attorney, Agent, or Firm* — Birch, Stewart, Kolasch & Birch, LLP

(57) ABSTRACT

Provided is an indium phosphide substrate having good linearity accuracy of a ridge line where the main surface is in contact with the orientation flat, and a method for producing the indium phosphide substrate. An indium phosphide substrate having a main surface and an orientation flat, wherein a maximum value of deviation is less than 1/1000 of a length of a ridge line where the main surface is in contact with the orientation flat, when a plurality of measurement points are set at intervals of 2 mm from a start point to an end point at the ridge line, except for a length portion of 3 mm inward from both ends of the ridge line, and based on a reference line which is a straight line connecting the start point and the end point, a distance of each measurement
(Continued)

point from the reference line is defined as the deviation of each measurement point.

7 Claims, 4 Drawing Sheets

(51) Int. Cl.
*C30B 29/40* (2006.01)
*C30B 33/10* (2006.01)
*H10P 90/00* (2026.01)

(52) U.S. Cl.
CPC .......... *H10P 90/126* (2026.01); *H10P 90/128* (2026.01); *H10P 90/129* (2026.01); *H10W 46/201* (2026.01)

(58) Field of Classification Search
CPC . H01L 2223/54493; B28D 5/00; C30B 29/40; C30B 33/10; H10W 46/00; H10W 46/201; H10P 90/126; H10P 90/128; H10P 90/129
See application file for complete search history.

(56) References Cited

U.S. PATENT DOCUMENTS

| | | | | |
|---|---|---|---|---|
| 2004/0119956 | A1* | 6/2004 | Fukagawa | G03F 7/70616 355/53 |
| 2006/0039595 | A1* | 2/2006 | Adel | G06V 40/171 382/294 |
| 2012/0058581 | A1 | 3/2012 | Tsuji | |
| 2013/0075938 | A1* | 3/2013 | Yang | G03F 1/42 257/E23.179 |
| 2014/0287226 | A1* | 9/2014 | Hori | C30B 29/36 428/332 |
| 2015/0330919 | A1* | 11/2015 | Hashimoto | H10D 62/8503 250/395 |
| 2016/0043248 | A1 | 2/2016 | Noda et al. | |
| 2017/0372965 | A1 | 12/2017 | Nishibayashi et al. | |
| 2018/0033739 | A1* | 2/2018 | Seddon | H01L 23/544 |
| 2019/0189438 | A1* | 6/2019 | Mikawa | C30B 33/06 |
| 2020/0066850 | A1* | 2/2020 | Nishioka | C30B 29/40 |
| 2022/0199770 | A1 | 6/2022 | Itani et al. | |

FOREIGN PATENT DOCUMENTS

| | | | | |
|---|---|---|---|---|
| JP | 5-90234 | A | | 4/1993 |
| JP | 6-349887 | A | | 12/1994 |
| JP | 2001-267235 | A | | 9/2001 |
| JP | 2003100575 | A | * | 4/2003 |
| JP | 2004-311726 | A | | 11/2004 |
| JP | 2005-101120 | A | | 4/2005 |
| JP | 2014-28723 | A | | 2/2014 |
| JP | 2014-186264 | A | | 10/2014 |
| JP | 5842920 | B2 | | 1/2016 |
| JP | 6701417 | B1 | | 5/2020 |
| KR | 10-2021-0122817 | A | | 10/2021 |
| WO | WO 2021/019887 | A1 | | 2/2021 |

OTHER PUBLICATIONS

Chinese Office Action and Search Report for corresponding Chinese Application No. 202080025487.2, dated Jun. 7, 2023.
Extended European Search Report for European Application No. 20846284.6, dated Nov. 9, 2022.
International Preliminary Report on Patentability and English translation of the Written Opinion of the International Searching Authority (Forms PCT/IB/338, PCT/IB/373, and PCT/ISA/237) for International Application No. PCT/JP2020/020789, dated Feb. 10, 2022.
International Search Report (Form PCT/ISA/210) for International Application No. PCT/JP2020/020789, dated Jun. 23, 2020, with an English translation.
Korean Office Action for Korean Application No. 10-2021-7027680, dated Nov. 15, 2022, with an English translation.
U.S. Office Action for U.S. Appl. No. 17/603,215, dated Jun. 20, 2024.
International Search Report for PCT/JP2020/020788 (PCT/ISA/210) mailed on Jun. 23, 2020.
International Preliminary Report on Patentability and English translation of the Written Opinion of the International Searching Authority (Forms PCT/IB/338, PCT/IB/373 and PCT/ISA/237) for International Application No. PCT/JP2020/020788, dated Feb. 10, 2022.
Extended European Search Report for corresponding European Application No. 20848623.3, dated Nov. 11, 2022.
Korean Office Action for corresponding Korean Application No. 10-2021-7027679, dated Nov. 14, 2022, with an English translation.
U.S. Office Action for U.S. Appl. No. 17/603,215, dated Jul. 28, 2025.
European Communication pursuant to Article 94(3) EPC for European Application No. 20 848 623.3, dated Dec. 4, 2025.
U.S. Office Action for U.S. Appl. No. 17/603,215, dated Feb. 5, 2026.

* cited by examiner

INDIUM PHOSPHIDE SUBSTRATE AND METHOD FOR PRODUCING INDIUM PHOSPHIDE SUBSTRATE

FIELD OF THE INVENTION

The present invention relates to an indium phosphide substrate, and a method for producing an indium phosphide substrate.

BACKGROUND OF THE INVENTION

Indium phosphide (InP) is a Group III-V compound semiconductor material composed of indium (In) of Group III and phosphorus (P) of Group V. The semiconductor material has characteristics in which a band gap is 1.35 eV, and an electron mobility is −5400 $cm^2/V \cdot s$, and the electron mobility under a high electric field is higher than that of other general semiconductor materials such as silicon and gallium arsenide. Further, the semiconductor material has characteristics in which its stable crystal structure under ordinary temperature and ordinary pressure is a cubic sphalerite type structure, and its lattice constant is larger than that of a compound semiconductor such as gallium arsenide (GaAs) and gallium phosphide (GaP).

An indium phosphide ingot which is a raw material for the indium phosphide substrate is generally sliced to have a predetermined thickness, ground to have a desired shape, mechanically polished as needed, and then subjected to etching or precision polishing in order to remove polishing debris and damage caused by polishing.

A common practice for indicating a crystal orientation of an indium phosphide substrate is an orientation flat method, for example, as disclosed in Patent Document 1, which cuts out a bow-shaped portion of a predetermined region of a circular substrate (wafer) to expose a surface having a specific plane orientation. A short line segment indicating the orientation is called an orientation flat. In a wafer process, the orientation of the wafer is determined based on the orientation flat to perform various steps.

CITATION LIST

Patent Literatures

[Patent Literature 1] Japanese Patent Application Publication No. 2014-028723 A

SUMMARY OF THE INVENTION

Technical Problem

In the wafer process, the orientation flat as described above is used as a reference to determine the orientation of the wafer, and its accuracy is important. In particular, for an indium phosphide substrate having a main surface and an orientation flat, when the indium phosphide substrate is observed from above the main surface with an optical microscope or the like, and the orientation flat is used as a reference for determining the orientation of the wafer, linearity of a ridge line where the main surface is in contact with the orientation flat is very important.

However, in the orientation flat method which cuts a bow-shaped portion of a predetermined region of a circular indium phosphide substrate (wafer) to expose a surface having a specific plane orientation, it is generally difficult to improve the accuracy of the linearity of the ridge line where the main surface is in contact with the orientation flat. Therefore, there is a need for a technique of improving the accuracy of the linearity of the ridge line.

The present invention has been made to solve the above problems. An object of the present invention is to provide an indium phosphide substrate having good linearity accuracy of a ridge line where the main surface is in contact with the orientation flat, and a method for producing the indium phosphide substrate.

Solution to Problem

In an embodiment, the present invention relates to an indium phosphide substrate having a main surface and an orientation flat, wherein a maximum value of deviation is less than 1/1000 of a length of a ridge line where the main surface is in contact with the orientation flat, when a plurality of measurement points are set at intervals of 2 mm from a start point to an end point at the ridge line, except for a length portion of 3 mm inward from both ends of the ridge line, and based on a reference line which is a straight line connecting the start point and the end point, a distance of each measurement point from the reference line is defined as the deviation of each measurement point.

In an embodiment of the indium phosphide substrate according to the present invention, the maximum value of the deviation is 1/1500 or less of the length of the ridge line.

In another embodiment, the indium phosphide substrate according to the present invention has a thickness of from 300 to 900 μm.

In yet another embodiment of the indium phosphide substrate according to the present invention, the length of the ridge line is from 8 to 50% of a diameter of the main surface.

In yet another embodiment of the indium phosphide substrate according to the present invention, an outer edge of the main surface comprises the orientation flat and a circular arc portion connected to the orientation flat, and wherein a maximum diameter of the main surface is more than or equal to the length of the ridge line, and is from 49 to 151 mm.

In another embodiment, the present invention relates to a method for producing an indium phosphide substrate, comprising the steps of: grinding an ingot of indium phosphide at a grinding wheel feed rate of 20 to 35 mm/min using a grinding wheel having a grit size of #270 to #400 to form an orientation flat; cutting out at least one wafer having a main surface and an orientation flat from the ground ingot of indium phosphide; chamfering an outer circumference portion of the wafer other than end faces of forming the orientation flat; polishing at least one surface of the chamfered wafer; and etching the polished wafer under the following etching conditions:

etching conditions:

(Composition of Etching Solution)

when the composition comprises 85% by mass of aqueous phosphoric acid solution and 30% by mass of hydrogen peroxide solution, the composition has a volume ratio of the aqueous phosphoric acid solution:the hydrogen peroxide of 0.2 to 0.4:0.1, the balance being water so as to add up to 1 as the total etching solution;

(Temperature of Etching Solution)

from 60 to 100° C.;

(Etching Time)

from 8 to 15 minutes.

In another embodiment, the present invention relates to a method for producing an indium phosphide substrate, comprising the steps of: grinding an ingot of indium phosphide to form an orientation flat; cutting out at least one wafer having a main surface and an orientation flat from the ground ingot of indium phosphide; griding end faces of the orientation flat on the wafer at a grinding wheel feed rate of 60 to 180 mm/min using a grinding wheel having a grit size of #800 to #1200 and chamfering an outer circumference portion other than the orientation flat; polishing at least one surface of the chamfered wafer; and etching the polished wafer under the following etching conditions:

etching conditions:

(Composition of Etching Solution)

when the composition comprises 85% by mass of aqueous phosphoric acid solution and 30% by mass of hydrogen peroxide solution, the composition has a volume ratio of the aqueous phosphoric acid solution:the hydrogen peroxide of 0.2 to 0.4:0.1, the balance being water so as to add up to 1 as the total etching solution;

(Temperature of Etching Solution)

from 60 to 100° C.;

(Etching Time)

from 8 to 15 minutes.

Advantageous Effects of Invention

According to the embodiments of the present invention, it is possible to provide an indium phosphide substrate having good linearity accuracy of a ridge line where the main surface is in contact with the orientation flat, and a method for producing the indium phosphide substrate.

DETAILED DESCRIPTION OF THE INVENTION

[Indium Phosphide Substrate]

Figure 1:
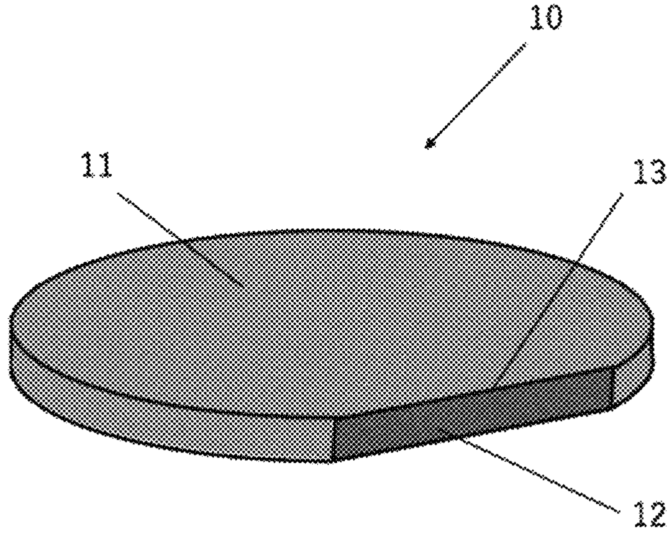
FIG. 1 is a schematic external view of an indium phosphide substrate according to an embodiment of the present invention.

First, a structure of an indium phosphide substrate according to the present embodiment will be described.

An indium phosphide substrate 10 according to the present embodiment has a main surface 11 and an orientation flat 12. Further, a line where the main surface 11 is in contact with the orientation flat 12 is a ridge line 13.

The "main surface" is a surface where epitaxial growth is carried out to form a semiconductor device structure. The "orientation flat" is a portion that appears after an outer circumference portion of a crystal is cut out into, for example, a bow shape, and corresponds to a straight portion formed on a part of the outer circumference when the main surface of the substrate is viewed from above. The orientation flat mainly serves to indicate a crystal orientation of the substrate. The orientation flat is formed in a direction perpendicular to the main surface of the substrate when visually observed.

Plane orientations of the main surface 11 and the orientation flat 12 of the indium phosphide substrate 10 according to an embodiment of the present invention may be, for example, a <110> orientation proximate from the (100) plane or a plane inclined to the <110> orientation in a range of 0° to 5° for the main surface 11, and an equivalent plane consisting of (0-1-1), (0-11), (011) and (01-1) planes for the orientation flat 12. Strictly speaking, for example, the orientation flat of the wafer having a main surface inclined by 5° in the [111] orientation from the (100) plane will be a plane inclined by 5° from the (0-1-1) plane. Further, the embodiment of the present invention may also be applied to a case of having the orientation flat in the direction rotated by 45°, in addition to the (011) plane, and is not limited as long as the plane is any particular plane that is substantially perpendicular to the main surface 11 of the indium phosphide substrate 10, as described above. Further, although the present invention relates to a technique for producing the orientation flat of indium phosphide substrates, it is not limited to techniques for producing orientation flats applies to circular indium phosphide substrates, and is effective for improving the linearity of the ridge portion of the orientation flat applied to a rectangular substrate, and can be applied to rectangular substrates as well.

The orientation flat 12 of the indium phosphide substrate 10 may be formed from a portion that appears after cutting a part of the outer circumference of the circular substrate into the bow shape. In this case, an outer edge of the main surface 11 is comprised of the orientation flat 12 and a circular arc portion connected to the orientation flat 12. In this case, a maximum diameter of the main surface 11 may be from 49 to 151 mm or from 49 to 101 mm. The maximum diameter of the main surface 11 is more than or equal to the length of the ridge line. The indium phosphide substrate 10 may be a rectangle shape, such as a square.

The length of the ridge line 13 where the main surface 11 is in contact with the orientation flat 12 is not particularly limited as long as it is a length sufficient to ensure an area of the main surface 11. The length is preferably 8 to 50% of a wafer diameter (a diameter of the main surface 11). If the length of the ridge line 13 where the main surface 11 is in contact with the orientation flat 12 is less than 8% of the wafer diameter (the diameter of the main surface 11), it may be difficult to confirm the existence of the orientation flat (OF). If the length of the ridge line 13 where the main surface 11 is in contact with the orientation flat 12 is more than 50% of the wafer diameter (the diameter of the main surface 11), it may cause a problem of reducing the effective area of the wafer. The length of the ridge 13 where the main surface 11 is in contact with the orientation flat 12 is more preferably 10 to 40% of the wafer diameter (the diameter of the main surface 11), and even more preferably 20 to 40%.

The indium phosphide substrate 10 preferably a thickness of, for example, from 300 to 900 μm, and more preferably from 300 to 700 μm, although not particularly limited thereto. If the thickness of the indium phosphide substrate 10 is less than 300 μm, it may crack, especially when the diameter is larger, and if it is more than 900 μm, a problem of wasting base metal crystals may be caused.

For the indium phosphide substrate 10, when a plurality of measurement points from a start point to an end point are set at intervals of 2 mm in the ridge line 13, except for a length portion of 3 mm inward from both ends of the ridge line 13, and based on a reference line which is a straight line connecting the start point to the end point, a distance of each measurement point from the reference line is defined as deviation of each measurement point, the maximum value of the deviation is controlled to be less than 1/1000 of the length of the ridge line 13.

Figure 2:
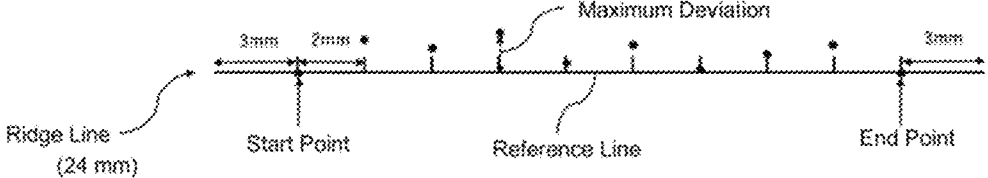
FIG. 2 is a view illustrating an example of a method for measuring a ridge line when a length of the ridge line of an indium phosphide substrate according to an embodiment of the present invention is 24 mm.

The maximum value of the deviation will be explained in more detail using the drawings. FIG. 2 shows a case where the length of the ridge line 13 of the indium phosphide substrate is 24 mm. First, 10 measurement points in total are set at intervals of 2 mm from the start point to the end point in the length portion of 18 mm in total, except for the length portion of 3 mm inward from the both ends of the ridge line 13. In FIG. 2, each measurement point is indicated by a black circle. Next, the straight line connecting the start point to the end point is used as the reference line, and the distance of each measurement point from the reference line is defined as the deviation of each measurement point. The deviation at a total of eight measurement points, except for the start and end points, is evaluated, and the largest one is defined as the maximum deviation. In FIG. 2, the deviation at the fourth measurement point counted from the start point is the largest. It should be understood that FIG. 2 is created for illustrative purposes only, and does not show any exact relationship (a ratio, or the like) between the actual ridge line and deviation.

Figure 3:
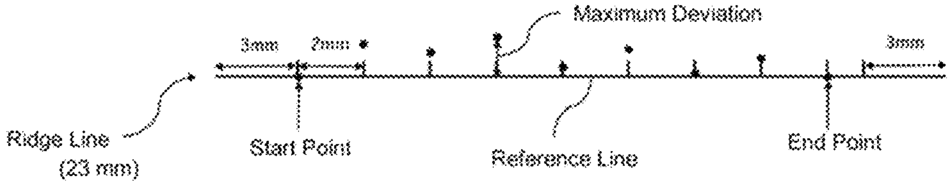
FIG. 3 is a view illustrating an example of a method for measuring a ridge line when a length of the ridge line of an indium phosphide substrate according to an embodiment of the present invention is 23 mm.

FIG. 3 shows a case where the length of the ridge line 13 of the indium phosphide substrate is 23 mm. First, 9 measurement points in total are set at intervals of 2 mm from the start point to the end point in the length portion of 17 mm in total, except for the length portion of 3 mm inward from the both ends of the ridge line 13. In FIG. 3, each measurement point is indicated by a black circle. Next, the straight line connecting the start point to the end point is used as the reference line, and the distance of each measurement point from the reference line is defined as the deviation of each measurement point. The deviation at a total of 7 measurement points, except for the start and end points, is then evaluated, and the largest one is defined as the maximum deviation. In FIG. 3, the deviation at the fourth measurement point counted from the start point is the largest. It should be understood that FIG. 3 is created for illustrative purposes only, and does not show any exact relationship (a ratio, or the like) between the actual ridge line and deviation. In the example of FIG. 3, as a result of setting the measurement points at intervals of 2 mm from the start point, the last point set at intervals of 2 mm (end point) does not coincide with the end of the length portion, which excludes the length portion of 3 mm inward from the both ends of the ridge line. On the other hand, in the example shown in FIG. 2, as a result of setting measurement points at intervals of 2 mm from the start point, the last point set at intervals of 2 mm (the end point) coincides with the end of the length portion, which excludes the length portion of 3 mm inward from the both ends of the ridge line.

That is, the method of taking the measurement points of the ridge line 13 in the present invention is to set the start point at a point of 3 mm inward from one end, and set the measurement points from the start point to the end point at intervals of 2 mm in the ridge line, except for 3 mm inward from the both ends of the ridge line, and set no measurement point if the interval from the other end is less than 3 mm. By defining it in this method, the above maximum deviation can be evaluated even if the length of the ridge line 13 includes an even value, an odd value, a significant decimal value, or the like (for example, when the length of the ridge line of the orientation flat is 22.2 mm).

For the indium phosphide substrate 10, the maximum value of the deviation as described above is controlled to be less than 1/1000 of the length of the ridge line 13. According to this configuration, when the indium phosphide substrate 10 is observed from above the main surface 11 with an optical microscope or the like, and the orientation flat 12 is used as a reference for determining the orientation of the wafer, the accuracy of the linearity of the ridge line 13 where the main surface 11 is in contact with the orientation flat 12 is improved, so that the wafer can be accurately determined in the desired orientation.

The maximum value of the above deviation is preferably less than 1/1500 of the length of the ridge line 13, and more preferably less than 1/2000, and even more preferably less than 1/2500.

[Method for Producing Indium Phosphide Substrate]

Figure 4:
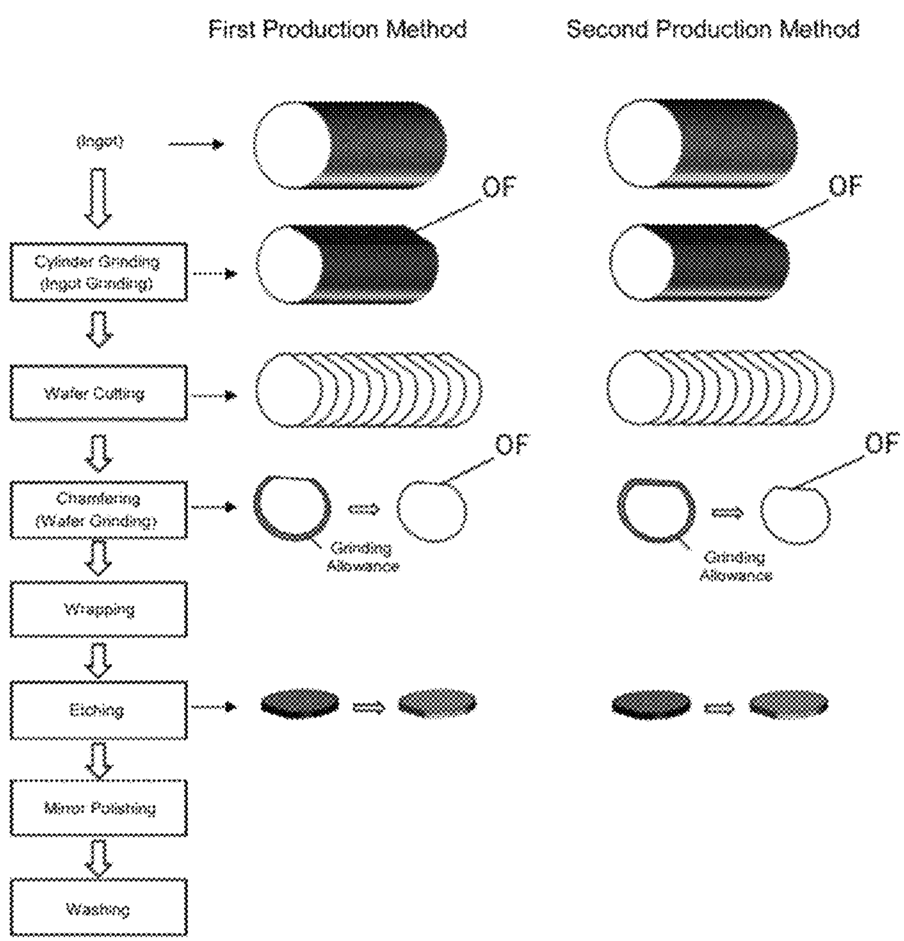
FIG. 4 is a schematic view showing each step of a first production method and a second production method for an indium phosphide substrate according to an embodiment of the present invention, and an ingot or a wafer produced in each step.

Next, a method for producing an indium phosphide substrate according to an embodiment of the present invention will be described. The method for producing the indium phosphide substrate according to the present invention includes a first production method and a second production method. FIG. 4 shows a schematic view of each step of the first and second production methods, and an ingot or a wafer produced in each of the steps.

(First Production Method)

In the first production method for an indium phosphide substrate, first, an ingot of indium phosphide is prepared by a known method.

The ingot of indium phosphide is then ground into a cylinder at a grinding wheel feed rate of 20 to 35 mm/min using a grinding wheel having a grit size of #270 to #400, and an orientation flat (OF) is formed.

In the technical field to which the present invention belongs, the number used as the "grit size #" corresponds to a grain size of the grinding wheel; the larger the number of the grit size #, the smaller the grain size of the grinding wheel, and the smaller the number of the grit size, the larger the grain size of the grinding wheel.

The "grinding wheel feed rate" refers to a speed at which the wheel rotational axis moves relative to the ingot with the rotating wheel pressed against the ingot of indium phosphide for grinding.

Subsequently, at least one wafer having the main surface and the orientation flat is cut out from the ground indium phosphide ingot. In this case, both crystal ends of the ingot of indium phosphide are cut along a predetermined crystal plane using a wire saw or the like to cut out a plurality of wafers to have a predetermined thickness.

Subsequently, in each of the wafers, an outer circumference portion other than the end faces that form the orientation flat is chamfered. Here, the outer circumference portion other than the end faces that form the orientation flat are shown as "grinding allowance" in the chamfering (wafer grinding) step of the first production method in FIG. 4.

Subsequently, at least one surface, preferably both surfaces, of the chamfered wafer is polished. The polishing step is also called a lapping step, and the wafer is polished with certain abrasives to remove irregularities on the wafer surface.

Next, the polished wafer is etched under the following etching conditions:

Etching Conditions

[Composition of Etching Solution]

when the composition comprises 85% by mass of aqueous phosphoric acid solution and 30% by mass of hydrogen peroxide solution, the composition has a volume ratio of the aqueous phosphoric acid solution:the hydrogen peroxide of 0.2 to 0.4:0.1, the balance being water so as to add up to 1 as the total etching solution;

[Temperature of Etching Solution]

from 60 to 100° C.;

[Etching Time]

from 8 to 15 minutes

The wafer is etched by immersing the entire wafer in the etching solution.

The main surface of the wafer is then polished with abrasives for mirror polishing to finish it into a mirror surface.

The resulting polished wafer is then washed to produce an indium phosphide wafer according to an embodiment of the present invention.

In the first production method for the indium phosphide substrate, the linearity of the ridge portion of the orientation flat is controlled by optimizing the conditions for forming the orientation flat on the indium phosphide ingot and the etching conditions for the polished wafer.

(Second Production Method)

In the second production method for an indium phosphide substrate, first, an ingot of indium phosphide is prepared by a known method.

The ingot of indium phosphide is then ground into a cylinder, and an orientation flat (OF) is formed.

At least one wafer having the main surface and the orientation flat is then cut out from the ground ingot of indium phosphide. In this case, both crystal ends of the ingot of indium phosphide are cut along a predetermined crystal plane using a wire saw or the like to cut out a plurality of wafers to have a predetermined thickness.

The end faces of the orientation flat on the wafer is then ground at a grinding wheel feed rate of 60 to 180 mm/min using a grinding wheel having a grit size of #800 to #1200. The “grinding wheel feed rate” refers to a speed at which the wheel rotational axis moves relative to the ingot with the rotating wheel pressed against the ingot of indium phosphide for grinding. The ground outer circumference portion in this step is the portion shown as “grinding allowance” in the chamfering (wafer grinding) step of the second production method in FIG. 4, and only the end faces are ground without chamfering the orientation flat portion. The outer circumference portion other than the orientation flat portion is chamfered.

Subsequently, at least one surface, preferably both surfaces, of the chamfered wafer is polished. The polishing step is also called a lapping step, and the wafer is polished with a predetermined abrasive material to remove irregularities on the wafer surface.

Next, the polished wafer is etched under the following etching conditions:

Etching Conditions

[Composition of Etching Solution]

when the composition comprises 85% by mass of aqueous phosphoric acid solution and 30% by mass of hydrogen peroxide solution, the composition has a volume ratio of the aqueous phosphoric acid solution:the hydrogen peroxide of 0.2 to 0.4:0.1, the balance being water so as to add up to 1 as the total etching solution;

[Temperature of Etching Solution]

from 60 to 100° C.

[Etching Time]

from 8 to 15 minutes

The wafer is etched by immersing the entire wafer in the etching solution.

The main surface of the wafer is then polished with an abrasive material for mirror polishing to finish it into a mirror surface.

The resulting polished wafer is then washed to produce an indium phosphide wafer according to an embodiment of the present invention.

In the second production method for the indium phosphide substrate, the linearity of the ridge portion of the orientation flat is controlled by optimizing the conditions for grinding the end faces of the orientation flat on the wafer and the etching conditions for the polished wafer.

It should be noted that if the grinding of the end faces of the orientation flat on the wafer in the second production method for the indium phosphide substrate is simply carried out under the same conditions as, for example, the grinding in the first production method for the indium phosphide substrate as described above, or if the end faces are simply ground more finely, it is difficult to control the linearity of the ridge line as in the indium phosphide substrate according to the embodiment of the present invention. This is because the grinding method is different between the ingot grinding and the wafer grinding, and in the wafer grinding, the wafer may vibrate in particular during grinding.

By epitaxially growing a semiconductor thin film onto the indium phosphide substrate according to the embodiment of the present invention by a known method, a semiconductor epitaxial wafer can be produced. As an example of the epitaxial growth, an InAlAs buffer layer, an InGaAs channel layer, an InAlAs spacer layer and an InP electron supply layer may be epitaxially grown onto the indium phosphide substrate to form a HEMT structure. When producing a semiconductor epitaxial wafer having such a HEMT structure, in general, a mirror-finished indium phosphide substrate is etched with an etching solution such as sulfuric acid/hydrogen peroxide solution to remove impurities such as silicon (Si) adhering to the substrate surface. In general, an amount removed by etching here is minute and does not change the ridge line of the orientation flat portion. Then, on the etched indium phosphide substrate, an epitaxial film is formed by molecular beam epitaxy (MBE) or metal organic chemical vapor deposition (MOCVD).

EXAMPLES

Hereinafter, Examples are provided for better understanding of the present invention and its advantages. However, the present invention is not limited to these Examples.

Test Example 1

Based on the production flow of the first production method as described above, Examples 1 to 4 and Comparative Examples 1 to 4 were produced as follows:

First, ingots of monocrystals of indium phosphide grown to have a diameter of 80 mm or more were prepared.

The outer circumference of each ingot of each monocrystal of indium phosphide was ground into a cylinder and to form an orientation flat (OF). For the grinding of the outer circumference of the ingot, the grinding wheel employed the grit size # and metal bond as shown in Table 1, and the grinding wheel feed rate was set as shown in Table 1.

Next, the wafer having the main surface and the orientation flat was cut out from the ground ingot of indium phosphide. In this case, both crystal ends of the ingot of indium phosphide were cut along the predetermined crystal plane using a wire saw to cut out a plurality of wafers each having the predetermined thickness.

Subsequently, for each of the wafers, the outer circumference portion other than the end faces forming the orientation flat were chamfered.

Both sides of the chamfered wafer were then polished with abrasives to remove irregularities on the wafer surface.

The wafer was then immersed in an etching solution to etch the wafer at a specified temperature for a predetermined time. Table 1 shows the etching conditions. For the "APA Solution" shown in Table 1, 85% by mass of aqueous phosphoric acid solution was used, for the "HP Solution", 30% by mass of hydrogen peroxide solution was used, and for "Sulfuric Acid", 96% by mass of sulfuric acid was used.

Next, the main surface of the wafer was polished to finish it with abrasives for mirror surface polishing to form a mirror surface, and then washed to produce an indium phosphide substrate having a diameter of 76.2 mm and a thickness of 600 to 625 μm. The ridge line of the orientation flat of the indium phosphide substrate was formed to have a length of 22 mm.

Test Example 2

As Example 5, an indium phosphide substrate was produced by the same method as in the above Examples 1 to 4, except for the following points 1) and 2):

1) An ingot of a monocrystal of indium phosphide grown to have a diameter of 104 mm or more was prepared.
2) The main surface of the wafer was polished with abrasives for mirror surface polishing to form a mirror surface, and then washed to produce an indium phosphide substrate having a diameter of 100 mm and a thickness of 600 to 625 μm. The ridge line of the orientation flat of the indium phosphide substrate was formed to have a length of 32.5 mm.

Test Example 3

Based on the production flow of the second production method as described above, Examples 6 to 9 and Comparative Examples 5 to 8 were produced as follows:

First, ingots of monocrystals of indium phosphide grown to have a diameter of 80 mm or more were prepared.

The outer circumference of each ingot of each monocrystal of indium phosphide was then ground into a cylinder and to form an orientation flat (OF). For the grinding of the outer circumference of the ingot, the grinding wheel employed the grit size # and metal bond as shown in Table 2, and the grinding wheel feed rate was set as shown in Table 2.

Next, the wafer having the main surface and the orientation flat was cut out from the ground ingot of indium phosphide. In this case, both crystal ends of the ingot of indium phosphide were cut along the predetermined crystal plane using a wire saw to cut out a plurality of wafers each having the predetermined thickness.

Subsequently, for each of the wafers, the end faces of the orientation flat were ground. The grinding wheel used for the grinding employed the grit size # shown in Table 2 and the grinding wheel feed rate shown in Table 2. The outer circumference portion other than the orientation flat portion was chamfered.

Both sides of the chamfered wafer were then polished with abrasives to remove irregularities on the wafer surface.

The wafer was then immersed in an etching solution to etch the wafer at a specified temperature for a predetermined time. Table 2 shows the etching conditions. For the "APA Solution" shown in Table 2, 85% by mass of aqueous phosphoric acid solution was used, for the "HP Solution", 30% by mass of hydrogen peroxide solution was used, and for "Sulfuric Acid", 96% by mass of sulfuric acid was used.

Next, the main surface of the wafer was polished with abrasives for mirror surface polishing to form a mirror surface, and then washed to produce an indium phosphide substrate having a diameter of 76.2 mm and a thickness of 600 to 625 μm. The ridge line of the orientation flat of the indium phosphide substrate was formed to have a length of 22 mm.

Test Example 4

As Example 10, an indium phosphide substrate was produced by the same method as in Examples 6 to 9 described above, except for the following points 1) and 2):

1) An ingot of a monocrystal of indium phosphide grown to have a diameter of 104 mm or more was prepared.
2) The main surface of the wafer was polished with abrasives for mirror surface polishing to form a mirror surface, and then washed to produce an indium phosphide substrate having a diameter of 100 mm and a thickness of 600 to 625 μm. The ridge line of the orientation flat of the indium phosphide substrate was formed to have a length of 32.5 mm.

Evaluation 1

For each of the indium phosphide substrates of Examples 1-4, Examples 6-9, and Comparative Examples 1-8, nine measurement points in total were set at intervals of 2 mm from the start point to the end point in a length portion having a total length of 16 mm, except for a length portion of 3 mm inward from both ends of the ridge line. The straight line connecting the start and end points was used as the reference line, and the distance of each measurement point from the reference line was defined as the deviation of each measurement point. The deviation at a total of seven measurement points, excluding the start and end points, was evaluated, and the largest one was determined to be the maximum deviation. Also, the ratio of the maximum deviation to the length of the ridge line was calculated.

Evaluation 2

For each of the indium phosphide substrates of Examples 5 and 10, fourteen measurement points in total were set at intervals of 2 mm from the start point to the end point in a length portion having a total length of 26.5 mm, except for a length portion of 3 mm inward from both ends of the ridge line. The straight line connecting the start and end points was used as the reference line, and the distance of each measurement point from the reference line was defined as the deviation of each measurement point. The deviation at a total of 12 measurement points, excluding the start and end points, was evaluated, and the largest one was determined to be the maximum deviation. Also, the ratio of the maximum deviation to the length of the ridge line was calculated.

The production conditions as described above and the results of Evaluation 1 and Evaluation 2 are shown in Tables 1 and 2.

TABLE 1

| | | | Example 1 | Example 2 | Example 3 | Example 4 | Example 5 |
|---|---|---|---|---|---|---|---|
| Wafer Shape (Final Shape) | Wafer Outer Diameter | (mm) | 76.2 | 76.2 | 76.2 | 76.2 | 100.0 |
| | Wafer Thickness | (µm) | 606 | 618 | 623 | 602 | 625 |
| | OF Length | (mm) | 22 | 22 | 22 | 22 | 32.5 |
| Ridge Line Forming Conditions | Ingot Outer Circumference Grinding | Grinding Wheel Grain Size | #270 | #400 | #270 | #270 | #400 |
| | | Grinding Wheel Feed Rate [mm/min] | 30 | 30 | 35 | 20 | 30 |
| | Wafer Outer Circumference Grinding | Grinding Wheel Grain Size | — | — | — | — | — |
| | | Grinding Wheel Feed Rate [mm/min] | — | — | — | — | — |
| | Etching Conditions | Solution Composition (volume ratio) | APA Solution: 0.3 HPSolution: 0.1 Water: 0.6 | APA Solution: 0.3 HPSolution: 0.1 Water: 0.6 | APA Solution: 0.3 HPSolution: 0.1 Water: 0.6 | APA Solution: 0.3 HPSolution: 0.1 Water: 0.6 | APA Solution: 0.3 HPSolution: 0.1 Water: 0.6 |
| | | Solution Temperature [° C.] | 70 | 70 | 70 | 70 | 70 |
| | | Etching (Immersing) Time [min] | 10 | 10 | 10 | 10 | 10 |
| Evaluation Results of Ridge Line Linearity | Maximum Deviation from Reference Line [µm] | | 12 | 6 | 20 | 11 | 9 |
| | Ratio of Maximum Deviation to Length of Ridge Line (permillage) | | 0.55 | 0.27 | 0.91 | 0.50 | 0.28 |

| | | | Comparative Example 1 | Comparative Example 2 | Comparative Example 3 | Comparative Example 4 |
|---|---|---|---|---|---|---|
| Wafer Shape (Final Shape) | Wafer Outer Diameter | (mm) | 76.2 | 76.2 | 76.2 | 76.2 |
| | Wafer Thickness | (µm) | 624 | 617 | 614 | 614 |
| | OF Length | (mm) | 22 | 22 | 22 | 22 |
| Ridge Line Forming Conditions | Ingot Outer Circumference Grinding | Grinding Wheel Grain Size | #270 | #200 | #270 | #270 |
| | | Grinding Wheel Feed Rate [mm/min] | 30 | 30 | 50 | 30 |
| | Wafer Outer Circumference Grinding | Grinding Wheel Grain Size | — | — | — | — |
| | | Grinding Wheel Feed Rate [mm/min] | — | — | — | — |
| | Etching Conditions | Solution Composition (volume ratio) | Sulfuric Acid: 0.7 HPSolution: 0.15 Water: 0.6 | APA Solution: 0.3 HPSolution: 0.1 Water: 0.6 | APA Solution: 0.3 HPSolution: 0.1 Water: 0.6 | APA Solution: 0.9 HPSolution: 0.1 Water: 0.0 |
| | | Solution Temperature [° C.] | 70 | 70 | 70 | 70 |
| | | Etching (Immersing) Time [min] | 10 | 10 | 10 | 10 |
| Evaluation Results of Ridge Line Linearity | Maximum Deviation from Reference Line [µm] | | 24 | 32 | 25 | 23 |
| | Ratio of Maximum Deviation to Length of Ridge Line (permillage) | | 1.09 | 1.45 | 1.14 | 1.05 |

TABLE 2

| | | | Example 6 | Example 7 | Example 8 | Example 9 | Example 10 |
|---|---|---|---|---|---|---|---|
| Wafer Shape (Final Shape) | Wafer Outer Diameter | (mm) | 76.2 | 76.2 | 76.2 | 76.2 | 100.0 |
| | Wafer Thickness | (μm) | 603 | 622 | 601 | 614 | 622 |
| | OF Length | (mm) | 22 | 22 | 22 | 22 | 32.5 |
| Ridge Line Forming Conditions | Ingot Outer Circumference Grinding | Grinding Wheel Grain Size | #400 | #400 | #400 | #400 | #400 |
| | | Grinding Wheel Feed Rate [mm/min] | 30 | 30 | 30 | 30 | 30 |
| | Wafer Outer Circumference Grinding | Grinding Wheel Grain Size | #800 | #1200 | #1200 | #1200 | #1200 |
| | | Grinding Wheel Feed Rate [mm/min] | 90 | 90 | 60 | 180 | 60 |
| | Etching Conditions | Solution Composition (volume ratio) | APA Solution: 0.3 HPSolution: 0.1 Water: 0.6 | APA Solution: 0.3 HPSolution: 0.1 Water: 0.6 | APA Solution: 0.3 HPSolution: 0.1 Water: 0.6 | APA Solution: 0.3 HPSolution: 0.1 Water: 0.6 | APA Solution: 0.3 HPSolution: 0.1 Water: 0.6 |
| | | Solution Temperature [° C.] | 70 | 70 | 70 | 70 | 70 |
| | | Etching (Immersing) Time [min] | 10 | 10 | 10 | 10 | 10 |
| Evaluation Results of Ridge Line Linearity | Maximum Deviation from Reference Line [μm] | | 20 | 9 | 8 | 14 | 15 |
| | Ratio of Maximum Deviation to Length of Ridge Line (permillage) | | 0.91 | 0.41 | 0.36 | 0.64 | 0.46 |

| | | | Comparative Example 5 | Comparative Example 6 | Comparative Example 7 | Comparative Example 8 |
|---|---|---|---|---|---|---|
| Wafer Shape (Final Shape) | Wafer Outer Diameter | (mm) | 76.2 | 76.2 | 76.2 | 76.2 |
| | Wafer Thickness | (μm) | 605 | 625 | 625 | 617 |
| | OF Length | (mm) | 22 | 22 | 22 | 22 |
| Ridge Line Forming Conditions | Ingot Outer Circumference Grinding | Grinding Wheel Grain Size | #400 | #400 | #400 | #400 |
| | | Grinding Wheel Feed Rate [mm/min] | 30 | 30 | 50 | 30 |
| | Wafer Outer Circumference Grinding | Grinding Wheel Grain Size | #800 | #800 | #800 | #800 |
| | | Grinding Wheel Feed Rate [mm/min] | 90 | 90 | 900 | 90 |
| | Etching Conditions | Solution Composition (volume ratio) | Sulfuric Acid: 0.7 HPSolution: 0.15 Water: 0.6 | APA Solution: 0.3 HPSolution: 0.1 Water: 0.6 | APA Solution: 0.3 HPSolution: 0.1 Water: 0.6 | APA Solution: 0.9 HPSolution: 0.1 Water: 0.0 |
| | | Solution Temperature [° C.] | 70 | 70 | 70 | 70 |
| | | Etching (Immersing) Time [min] | 10 | 10 | 10 | 10 |
| Evaluation Results of Ridge Line Linearity | Maximum Deviation from Reference Line [μm] | | 25 | 35 | 34 | 24 |
| | Ratio of Maximum Deviation to Length of Ridge Line (permillage) | | 1.14 | 1.59 | 1.55 | 1.09 |

Evaluation Results

In each of Examples 1 to 10, the maximum value of the deviation was less than or equal to 1/1000 of the length of the ridge line, and it provided an indium phosphide substrate having good linearity accuracy of the ridge line where the main surface was in contact with the orientation flat.

In each of Comparative Examples 1, 4, 5, and 8, the composition of the solution used for the etching process was not appropriate for the ridge line forming conditions, and the maximum value of the deviation was more than 1/1000 of the length of the ridge line.

In Comparative Example 2, the grain size of the grinding wheel used for the outer circumference grinding of the ingot was not appropriate for the ridge line forming conditions, and the maximum value of the deviation was more than 1/1000 of the length of the ridge line.

In Comparative Example 3, the grinding wheel feed rate set for the outer circumference grinding of the ingot was not appropriate for the ridge line forming conditions, and the maximum value of the deviation was more than 1/1000 of the length of the ridge line.

In Comparative Example 6, the grain size of the grinding wheel used for the outer circumference grinding of the wafer was not appropriate for the ridge line forming conditions, and the maximum value of the deviation was more than 1/1000 of the length of the ridge line.

In Comparative Example 7, the grinding wheel feed rate set for the outer circumference grinding of the wafer was not appropriate for the ridge line forming conditions, and the maximum value of the deviation was more than 1/1000 of the length of the ridge line.

DESCRIPTION OF REFERENCE NUMERALS

10 indium phosphide substrate
11 main surface
12 orientation flat
13 ridge line.

The invention claimed is:

1. An indium phosphide substrate comprising a main surface and an orientation flat, wherein:

the indium phosphide substrate includes a plurality of observation measurement points for evaluating linearity of a ridge line where the main surface is in contact with the orientation flat, said observation measurement points being located on the ridge line at intervals of 2 mm from a start point to an end point at the ridge line, except for a length portion of 3 mm inward from each end of the ridge line, a distance of each of the plurality of observation measurement points from a reference line is defined as a deviation of each respective observation measurement point, wherein the reference line is a straight line connecting the start point and the end point, and a maximum deviation of the plurality of observation measurement points, based on the deviation of each respective observation measurement point, is less than 1/1000 of a length of the ridge line.

2. The indium phosphide substrate according to claim 1, wherein the maximum value of the deviation is 1/1500 or less of the length of the ridge line.

3. The indium phosphide substrate according to claim 2, wherein the indium phosphide substrate has a thickness of from 300 to 900 km.

4. The indium phosphide substrate according to claim 1, wherein the length of the ridge line is from 8 to 50% of a diameter of the main surface.

5. The indium phosphide substrate according to claim 1, wherein an outer edge of the main surface comprises the orientation flat and a circular arc portion connected to the orientation flat, and wherein a maximum diameter of the main surface is more than or equal to the length of the ridge line, and is from 49 to 151 mm.

6. A method for producing an indium phosphide substrate comprising a main surface and an orientation flat, wherein: the indium phosphide substrate includes a plurality of observation measurement points for evaluating linearity of a ridge line where the main surface is in contact with the orientation flat, said observation measurement points being located on the ridge line at intervals of 2 mm from a start point to an end point at the ridge line, except for a length portion of 3 mm inward from each end of the ridge line, a distance of each of the plurality of observation measurement points from a reference line is defined as a deviation of each respective observation measurement point, wherein the reference line is a straight line connecting the start point and the end point, and a maximum deviation of the plurality of observation measurement points, based on the deviation of each respective observation measurement point, is less than 1/1000 of a length of the ridge line, the method comprising the steps of:

grinding an ingot of indium phosphide at a grinding wheel feed rate of 20 to 35 mm/min using a grinding wheel having a grit size of #270 to #400 to form the orientation flat;

cutting out at least one wafer having the main surface and the orientation flat from the ground ingot of indium phosphide;

chamfering an outer circumference portion of the wafer other than end faces of forming the orientation flat;

polishing at least one surface of the chamfered wafer; and forming the indium phosphide substrate by etching the polished wafer under the following etching conditions:

etching conditions:

when an etching solution composition comprises 85% by mass of aqueous phosphoric acid solution and 30% by mass of hydrogen peroxide solution, the composition has a volume ratio of the aqueous phosphoric acid solution:the hydrogen peroxide of 0.2 to 0.4:0.1, the balance being water so as to add up to 1 as the total etching solution;

temperature of the etching solution: from 60 to 100° C.;

etching time: from 8 to 15 minutes.

7. A method for producing an indium phosphide substrate comprising a main surface and an orientation flat, wherein: the indium phosphide substrate includes a plurality of observation measurement points for evaluating linearity of a ridge line where the main surface is in contact with the orientation flat, said observation measurement points being located on the ridge line at intervals of 2 mm from a start point to an end point at the ridge line, except for a length portion of 3 mm inward from each end of the ridge line, a distance of each of the plurality of observation measurement points from a reference line is defined as a deviation of each respective observation measurement point, wherein the reference line is a straight line connecting the start point and the end point, and a maximum deviation of the plurality of observation measurement points, based on the deviation of each respective observation measurement point, is less than 1/1000 of a length of the ridge line, the method comprising the steps of:

grinding an ingot of indium phosphide to form the orientation flat;

cutting out at least one wafer having the main surface and the orientation flat from the ground ingot of indium phosphide;

griding end faces of the orientation flat on the wafer at a grinding wheel feed rate of 60 to 180 mm/min using a grinding wheel having a grit size of #800 to #1200 and chamfering an outer circumference portion other than the orientation flat;

polishing at least one surface of the chamfered wafer; and forming the indium phosphide substrate by etching the polished wafer under the following etching conditions:

etching conditions:

when an etching solution composition comprises 85% by mass of aqueous phosphoric acid solution and 30% by mass of hydrogen peroxide solution, the composition has a volume ratio of the aqueous phosphoric acid solution:the hydrogen peroxide of 0.2 to 0.4:0.1, the balance being water so as to add up to 1 as the total etching solution;

temperature of the etching solution: from 60 to 100° C.;

etching time: from 8 to 15 minutes.

* * * * *